(12) United States Patent
Ross et al.

(10) Patent No.: US 6,504,368 B2
(45) Date of Patent: Jan. 7, 2003

(54) SPECTROSCOPIC MEASUREMENT METHOD USING NMR

(75) Inventors: Alfred Ross, Lörrach (DE); Götz Schlotterbeck, Efringen-Kirchen (DE); Hans Senn, Windisch (CH)

(73) Assignee: Hoffmann-La Roche Inc., Nutley, NJ (US)

( * ) Notice: Subject to any disclaimer, the term of this patent is extended or adjusted under 35 U.S.C. 154(b) by 0 days.

(21) Appl. No.: 09/829,356

(22) Filed: Apr. 9, 2001

(65) Prior Publication Data

US 2001/0045831 A1 Nov. 29, 2001

(30) Foreign Application Priority Data

Apr. 18, 2000 (EP) .............................. 00810338

(51) Int. Cl.[7] .................................. G01V 3/00
(52) U.S. Cl. ...................... 324/307; 324/309; 324/308; 324/318
(58) Field of Search ................ 324/306, 309, 324/307, 318, 321, 322

(56) References Cited

U.S. PATENT DOCUMENTS

| | | | |
|---|---|---|---|
| 4,021,726 A | 5/1977 | Garroway et al. | |
| 4,115,730 A | 9/1978 | Mansfield | |
| 4,335,282 A | 6/1982 | Adams et al. | |
| 4,520,316 A | 5/1985 | Hall et al. | |
| 4,623,844 A | * 11/1986 | Macovski | 324/313 |
| 4,652,826 A | * 3/1987 | Yamamoto et al. | 324/318 |
| 4,654,592 A | 3/1987 | Zens | |
| 4,703,270 A | 10/1987 | Hall et al. | |
| 5,221,518 A | 6/1993 | Mills | |
| 5,552,709 A | * 9/1996 | Anderson | 324/318 |
| 5,574,370 A | * 11/1996 | Woelk et al. | 324/318 |
| 6,177,798 B1 | * 1/2001 | Haner et al. | 324/300 |
| 6,222,365 B1 | * 4/2001 | Taniguchi et al. | 324/307 |

FOREIGN PATENT DOCUMENTS

EP 0 365 352 A 4/1990

OTHER PUBLICATIONS

Bateman, L., *Chemical Shift Imaging*, pp. 971–980, (1986).
Parella, T., *Magnetic Resonance in Chemistry*, 36: 467–495 (1998).
E. Macnamara et al., Analytica Chimica Acta, vol. 397, (1999) pp. 9–16.
Spraul, M. et al., Anal. Commun. (1997) vol. 34 pp. 339–341.

* cited by examiner

*Primary Examiner*—Edward Lefkowitz
*Assistant Examiner*—Dixomara Vargas
(74) *Attorney, Agent, or Firm*—George W. Johnston; John P. Parise

(57) ABSTRACT

For simultaneously determining the analytical NMR spectra of a number of samples placed suitably arranged in the measuring site of an NMR measuring apparatus, spatially and timely varying magnetic fields are used. The resulting signals are spatially resolved by a suited processing, for example Fourier transform. Surprisingly, from these signals, analytical NMRs of high resolution can be obtained for each sample. The method can be applied to two-dimensional arrangements of samples, for example a bundle of capillaries imitating a conventional NMR sample tube or a well plate, or three-dimensional arrangements, for example stacks of well plates. The method allows the determination of NMR spectra for analysis or for comparison with anterior spectra for long time behavior studies and quality assessment with only a fraction of time needed for measuring the samples individually.

23 Claims, 6 Drawing Sheets

Fig. 7
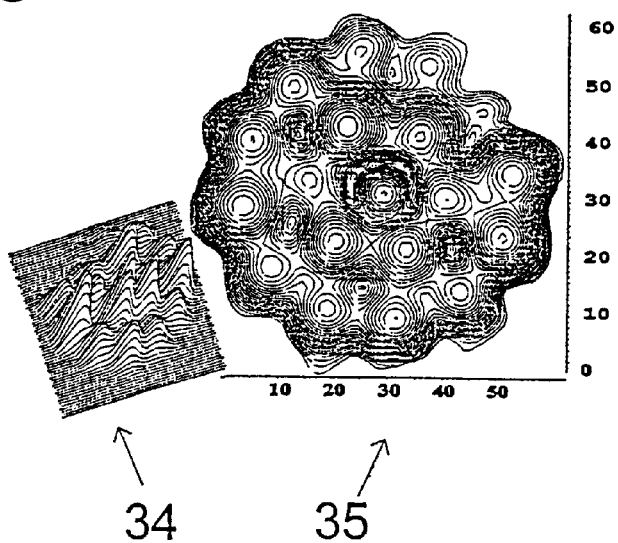
34    35
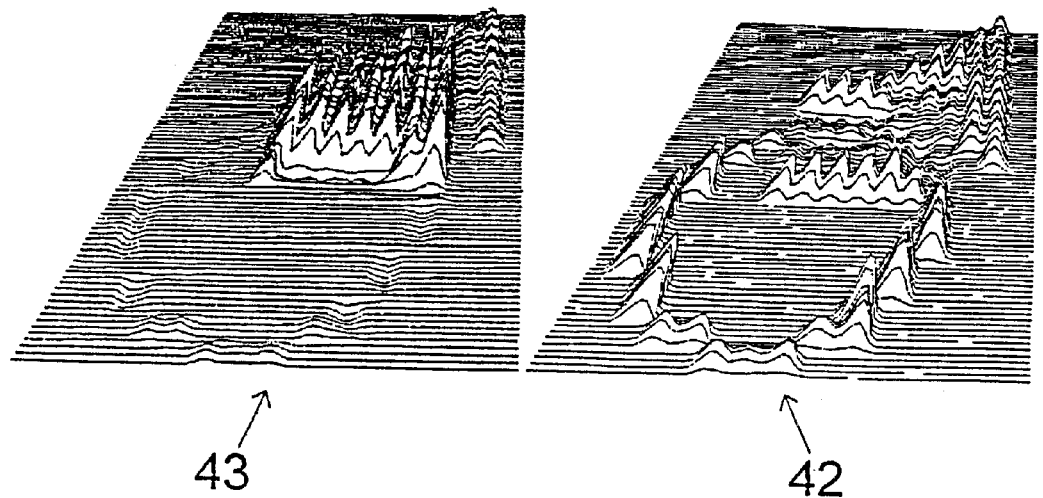
43    42
Fig. 8

SPECTROSCOPIC MEASUREMENT METHOD USING NMR

BACKGROUND OF THE INVENTION

1. Field

The present invention relates to a spectroscopic measurement method for determining analytical high resolution NMR spectra suited for structure determination and/or structure control of chemical compounds. A further aspect of the invention concerns a sample container adapted for being placed in the sample site of an NMR measurement apparatus for use in the mentioned method.

2. Description

NMR spectroscopy techniques are a part of most molecular structure determination and verification processes in all fields of chemical and bio-structural research. The emerging field of combinatorial chemistry, with its need to characterize large compound libraries used for screening in bio-assays, and the demand for quality control of compound depositories in the pharmaceutical industry, demonstrate that sample throughput achievable with the typical serial setups used in modern NMR laboratories is too low. This low throughput now limits the application of these techniques in the above mentioned contexts. The following summarizes the two serial procedures currently in use in analytical NMR laboratories:

Procedure using an Automatic Sample Changer:

(I) Solvation of substances to be investigated in 600 µl of NMR suitable (deuterated) solvent to a concentration of typically 10 mM.

(II) Transfer of each sample to a NMR sample tube (III) Positioning of up to 120 prepared samples in the carrousel of the automated sample changer.

(IV) Serial transfer of one sample after the other to the high field magnet and setting of experimental parameters (locking, shimming).

(V) Acquisition (and storage) of NMR data.

(VI) Back transfer of the samples to the sample changer.

(VII) Emptying of the sample changer.

(VIII) Disposal of samples and rinsing of (expensive) sample tubes.

For tasks (I)–(III) and (VII)–(VIII) manual and automated versions are found in NMR laboratories. Only tasks (IV)–(V) are always fully automated. The whole procedure typically takes about 10 min. per sample. Out of these tasks, about 6 mins. [tasks (IV)–(VII)] involve costly "NMR-time", whereby the actual detection of the signal takes only 1 min. Sample preparation and disposal can be done "off-line" and does not incur NMR-time.

To increase throughput, flow-through probe-heads have been developed and installed. In this setup a sample preparation robot is connected via a transfer capillary directly to the NMR detection cell. This procedure referred to as flow-injection NMR can be summarized as follows:

Flow Through Setup [Spraul, M., et al., *Anal. Commun.*, 34: 339–341 (1997)]:

(I) Solvation of substances to be investigated in 300 µl of NMR suitable (deuterated) solvent to a concentration of typically 10 mM in 96 well plates.

(II) Aspiration of each sample from a well to the capillary line and transfer to the NMR detection cell.

(III) Preparation of experimental parameters (locking, shimming).

(IV) Acquisition (and storage) of NMR data.

(V) Disposal of samples in waste and rinsing of the syringe and capillary system to prevent carry over of substance to the next NMR measurement.

Again, task (I) can be done manual or automated. The remaining tasks are fully roboterized. This procedure typically takes about 8 mins. per sample. Out of these 8 mins, about 5 mins. [tasks (II)–(V)] involve costly "NMR-time". Only the sample preparation step can be done "off-line". Again the detection of the signal takes only 1 min.

From the above summary, it is obvious that throughput rate is not limited by the NMR experiment itself but by the time necessary to position and remove the NMR sample in/from the detection volume.

An improvement in this respect is described in the literature where four detection volumes are mounted into a home-built flow-through probehead. The application of an inhomogeneous magnetic field along the z-axis together with a tailored data deconvolution method is used to measure four samples in parallel [MacNamara, E., et al., *Anal. Chim. Acta*, 397: 9–16 (1999)].

This method, however, is restricted to measurements of only a few samples in parallel as it necessitates a coil around each sample tube. For the same reason, a particularly adapted NMR probehead is needed.

Another problem of the current NMR methodology arises from the fact that a small portion of the available amount of material has to be consumed by the preparation of a NMR dedicated sample. For standard chemical analyses, this is typically not of much concern because for each structure verification only a single sample has to be prepared. But for the stability characterization of substances in large compound libraries, the problem is very serious. If each compound of a library is monitored once per year by NMR for structural integrity and each detection takes about 5% of the sample, then the complete library will be consumed within 20 years, a fact not often appreciated by the scientist responsible for the creation of the library.

According to U.S. Pat. No. 5,221,518, the contents of which are hereby incorporated by reference, a space-resolved NMR spectrum of a multiplicity of DNA samples can be obtained by labeling the nucleotides. However, this is only a subordinate aspect of the described invention. The obtained NMR signals can be used to detect the presence or absence of the respective labels, yet do not allow the structure to be determined, i.e. an analytical NMR signal cannot be obtained. The value of 80,000 samples, which the method should be able to measure simultaneously, is more theoretical than practical in nature. U.S. Pat. No. 4,520,316, the contents of which are hereby incorporated by reference, discloses a method for determining NMR spectra of, for example, 7 samples simultaneously. The method comprises measuring a number of NMR spectra with different field gradients applied. For calculating the NMR spectrum at a certain site, the spectra are shifted in frequency according to the respective magnetic field at the site. By comparing and adding, if predefined correlation criteria are met, the NMR spectrum of the site can be determined. Hence, this method avoids methods like Fourier transformation.

The main disadvantage of this method is that it does not provide increased throughput with regards to measuring the samples individually. In the example, it took 73 minutes to perform the needed measurements of the seven samples. Moreover, the method disclosed in this document is intended for use with tomographic scanners, i.e. for examining bodies of significant volume, and not for analytical NMR applications. The obtained NMR spectra are, therefore, not high resolution spectra, though clearly separate signals are resolved.

According to U.S. Pat. No. 4,703,270, the contents of which are hereby incorporated by reference, it is possible to determine zero-quantum-spectra simultaneously in sample sets. Measuring this kind of NMR spectra is meant to be insensible to inhomogenities of the magnetic field. However, this spectrum is determined indirectly, produces a much smaller signal, and an important kind of signal, namely those of singulett states (e.g. methyl-H), cannot be observed at all. The decreased signal amplitude requires increased measuring times, and the lack of singulett signals renders it impossible to derive the structure from the substance measured. In the example, the samples are contained in capillaries of 6 mm diameter, that is, of the usual NMR capillary size, and are arranged at a significant distance from each other. Thereby, the signal amplitudes are increased and the spatial resolution facilitated.

Accordingly, there is a need for a method that allows rapid simultaneous determination for a multiplicity of samples of the analytical spectra for structure control or structure determination. Similarly, there has been a long felt need for an NMR technique that reduces the sample volume required.

SUMMARY OF THE INVENTION

The subject invention provides a method for determining analytical high resolution NMR spectra for each of at least two chemical compounds that are contained within individual samples. These NMR spectra are suitable for structure determination or structure control of each of the at least two chemical compounds. The subject method comprises: (a) placing at least two samples, each containing one of the at least two chemical compounds, within the detection volume of a detection coil in an NMR measuring apparatus; (b) applying at least one spatially inhomogeneous magnetic field that penetrates the at least two samples within the detection volume of the detection coil in the NMR measuring apparatus, the at least one spatially inhomogeneous magnetic field having certain predetermined characteristics; (c) measuring the NMR after applying the at least one spatially inhomogeneous magnetic field, the characteristics of the inhomogeneous magnetic field, including the degree of spatial inhomogeneity, being set on at least two values to be measured; and (d) resolving the NMR signals picked-up by the detection coil during the measuring of the NMR using a spatially-resolving computational method, thereby determining the analytical high resolution NMR spectra for each of at least two chemical compounds.

Typically, the spatially resolving computational method comprises at least one Fourier transformation with respect to the variation of the inhomogeneity of the magnetic field. The Fourier transformation with respect to the variation of the inhomogeneity of the magnetic field is generally one Fourier transformation per space coordinate. In the subject invention one detection coil can encompass all of the samples penetrated by the magnetic field and all of the samples can be encompassed in the detection volume of the NMR measuring apparatus.

Preferably, at least two spatially inhomogeneous magnetic fields are applied, and the spatially-resolving computational method yields NMR signals with respect to the coordinates of the at least two spatially inhomogeneous magnetic fields in order to determine the individual NMR signals of the samples in a two-dimensional arrangement. More preferably, at least three spatially inhomogeneous magnetic fields are applied, and the spatially-resolving computational method yields NMR signals with respect to the coordinates of the at least three spatially inhomogeneous magnetic fields in order to determine the individual NMR signals of samples in a three-dimensional arrangement.

The subject invention further provides a sample container adapted for being placed in the detection volume of an NMR measurement apparatus. This sample container comprises at least two compartments that are configured and dimensioned to each contain a sample. The at least two compartments are configured, dimensioned and arranged so that NMR signals emitted by samples contained within the at least two compartments can be resolved by applying a spatially resolving computational method to NMR signals measured by a NMR measurement apparatus into which the sample container has been introduced.

Favorably, the sample container comprises at least seven compartments, for example, at least nine compartments, or at least nineteen compartments. The compartments can be NMR-suited capillary tubes that have an open inlet end and an open outlet end, the open inlet end and the open outlet end being configured and dimensioned so that they are connectable to a sample supply and a sample disposal, respectively. Alternatively, the compartments can be NMR-suited capillary tubes that are closed at one end and open at the other end, the capillary tubes being arranged as a bundle of generally circular cross-section so as to imitate a single sample tube.

Preferably, the capillary tubes have a volume of about 30 $\mu$l or less, and have a cross-sectional area of at most 1 mm$^2$.

The sample container can also comprises an adapter that is configured and dimensioned such that the sample container can be held in the detection volume of an analytical NMR measurement device in replacement of a conventional NMR tube. Favorably, the sample container comprises a three-dimensional arrangement of sample compartments. In one embodiment, a hull encompasses the sample compartments. Such a hull can be configured and dimensioned so as to produce interstices between the compartments and between the hull and the compartments, and the interstices can be fillable with a liquid. Preferably, the interstices are closed and filled with a liquid of adapted magnetic susceptibility in order to minimize disturbing the magnetic field in passing the walls of the compartments and the hull.

BRIEF DESCRIPTION OF THE FIGURES

The invention shall be further explained by way of preferred embodiments with reference to the accompanying drawings:

FIG. 6 2D NMR image of a 9-sample bundle.

FIG. 7 2D NMR image of a 19-sample bundle.

FIG. 8 2D NMR image of a 384-well plate.

DETAILED DESCRIPTION OF THE PREFERRED EMBODIMENTS

Figure 1:
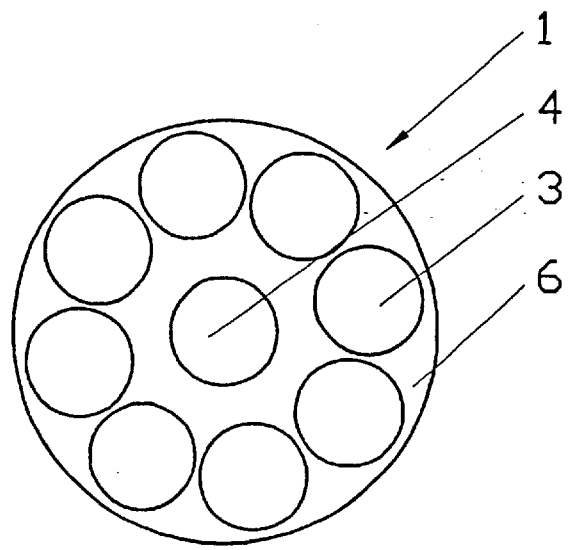
FIG. 1 Schematic cross-cut of a 9-sample bundle.

The subject invention will now be described in terms of its preferred embodiments. These embodiments are set forth to aid in understanding the invention but are not to be construed as limiting the invention as claimed.

Surprisingly, according to the invention described and claimed hereinafter, it is possible to use the principles of spatial resolution, which have been developed for the medical application of MRI, in analytical NMR spectroscopy. In medicine, the chemical shift is almost disregarded, merely the overall concentration of hydrogen at a certain position is determined. Even in more recent developments, where the chemical shift is taken into account, it is used only for distinguishing, e. g. two kinds of clearly different hydrogen atoms producing signals of very different chemical shift, like that of water and that of ethylene, in order to differentiate between water and lipids.

The method according to the preferred embodiment of the invention as hereafter described comprises evaluation of the NMR response not only in view of the chemical shift and other, spectroscopically and analytically interesting values, but also in space, by Fourier transformation. The NMR spectra thereby obtained are of surprisingly high quality and resolution.

In the following, it is presumed that $^1$H-NMR experiments are performed so that the gyromagnetic constant $\gamma=\gamma_H=2.6751988*10^8$ s$^{-1}$T$^{-1}$, and magnetic field strength and frequency values may be converted to each other using the Larmor formula: $\omega=2\pi f=\gamma B$, with: B: magnetic field strength [Tesla: 1 T=$10^4$ Gauss]; f: frequency [s$^{-1}$ or Hz]; $\omega$: radian frequency [s$^{-1}$].

Compartmentation of the Detection Volume of a NMR Spectrometer

In each compartment one compound to be analyzed is injected at standard concentration. The compartmentation was effected as follows:

(I) a) Filling the available detection volume of a standard NMR spectrometer with a bundle of capillaries instead of a single NMR tube (two designs), or
   b) Positioning of a complete 384-well plate in a medical NMR tomograph;
(II) Deconvolution of the data in NMR spectra for each compound using CSI (chemical shift imaging): This data acquisition and processing technique is adapted from the field of MRI, as applied in biology and medicine.

Application of both methods results in the following advantages when compared to the standard procedures presented in the introduction:

Compartmentation by capillaries results in an increase in sample throughput by a factor of 11 and 9 respectively when compared to the single-tube and the flow-through approach.

A reduction in the quantity of substance needed per spectra taken is achieved by the miniaturization of the sample container.

By using complete well plates, any loss of substances is circumvented, and libraries of samples can be characterized "non invasively". After measurement, the well plates with the samples may be put back to the storage.

Three-dimensional, further optimized geometries (e. g. stacks of two-dimensional arrangements) will further increase the throughput.

Automated filling of capillaries can be achieved on-line and off-line to the NMR spectrometer.

In the following, the technical features of the concept are described in detail:

1) Compartmentation of the Detection Volume:

Capillary Bundles used in Standard NMR Spectrometers:

To demonstrate the operability of the invention, two bundles of capillaries have been designed. The capillaries used were bought from Wilmad (Wilmad, Buena, USA) and are made of NMR suited glass (low paramagnetic contaminants together with high accuracy of wall thickness). The outer diameter (o. d.) of each capillary is 1.0 mm; the inner diameter (i. d.) is 0.8 mm.

9-capillary bundle 1

Figure 2:
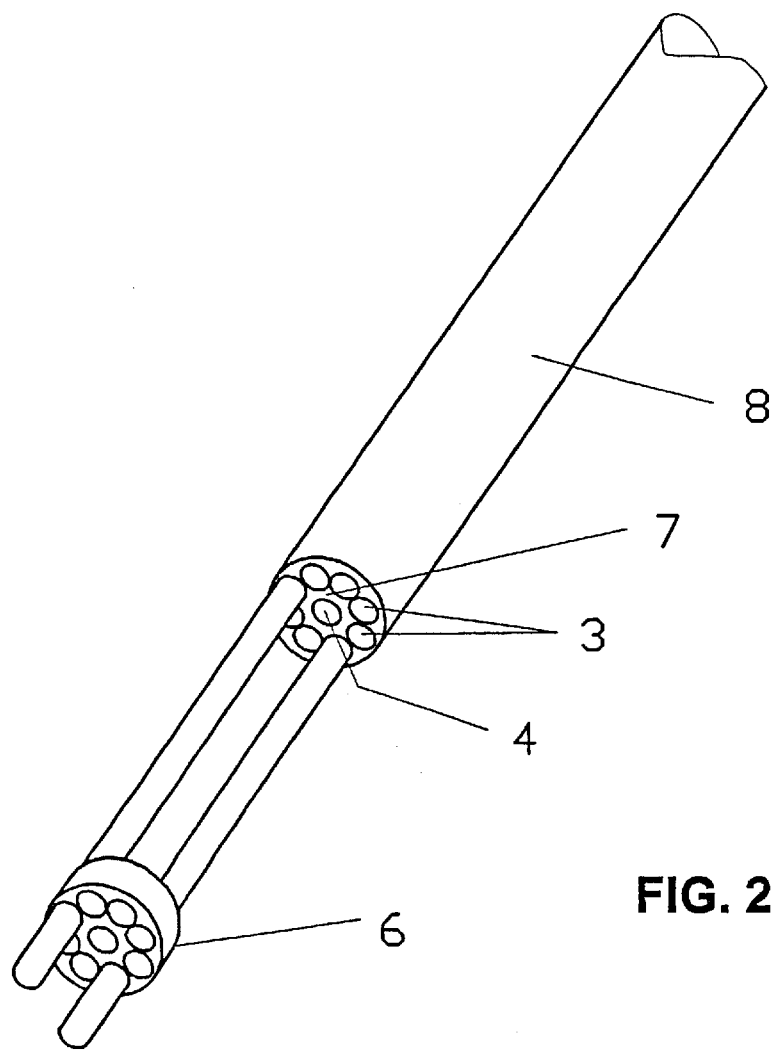
FIG. 2 Schematic view of the bundle of FIG. 1.

The first prototype was realized as a bundle of capillaries made to fit into a standard NMR sample tube of 5.0 mm o. d. (respectively 4.2 mm i. d.). The intercapillary space was filled with the same solvent as used for dissolving the solutes in the capillaries. This design was chosen to ensure the homogeneity of the magnetic field (a prerequisite for the NMR detection process). Therefore, we ended up with a design 1 as shown in FIG. 1, though the most compact arrangement contains one central capillary tube surrounded by six capillary tubes. An outer ring 3 of 8 plus 1 central capillary 4 are fixed at the bottom and the top in carriers 6, 7 made out of Plexiglas (trademark: a transparent thermoplastic polymethacrylate) in our in-house workshop. To enable proper positioning of this bundle in the NMR tube the upper carrier 7 is integrated in a cylindrical module 8 made of the same material (FIG. 2; for illustration purposes, only two capillary tubes shown). In the course of the experiments, it surprisingly turned out that the distortion of the magnetic field introduced by the removal of the intercapillary liquid was neglectable for the quality of the spectra (see FIG. 9). This design has the disadvantage that the active detection volume of the spectrometer with a diameter of 5.0 mm was not filled completely. This is due to the 0.4 mm glass wall of the standard NMR sample tube. To improve over this we decided in a second step to use the 19 capillary bundle design described below.

19-capillary Bundle 10

Figure 3:
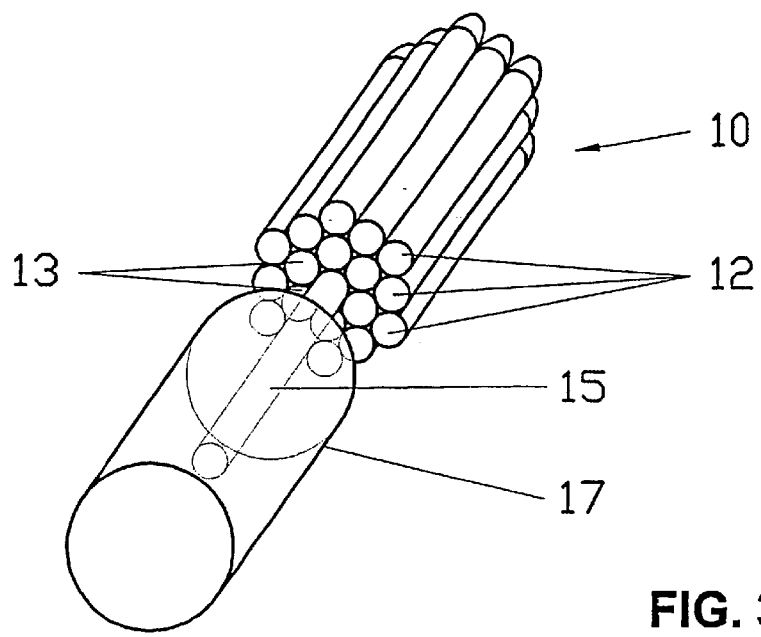
FIG. 3 Schematic view of a 19-sample bundle.

A drawing of this design is shown in FIG. 3. 18 capillaries are arranged in two rings (12 plus 6) 12 resp. 13 around a centered 19$^{th}$ capillary 15. As the dense packing of capillary prevents the construction of a carrier as used in the 9 capillary design we decided to fix the capillaries for this geometry by a standard two-component glue. The elongated 19$^{th}$ central capillary 15 is used to fix the whole bundle 10 in a Plexiglas module 17 mimicking the upper part of a 5.0 mm standard NMR tube, so that the individual capillaries have a cross-section area of about 1 mm$^2$. This is necessary to position the whole unit properly in the detection cell of the spectrometer. Using this bundle the acquisition of the NMR spectra of 19 compounds (see FIG. 10) was achieved within an "NMR-time" (time for positioning of the sample + acquisition of all data) of 10 min. (5 min. for transfer +5 min. for detection of signal). Using the introductionally described conventional sample changer setup, the "NMR-time" would be 19*(6 min.)=114 min. We roughly end up with an increase of throughput by a factor 11. For the flow-through setup the gain in throughput [19*(5 min.)=95 min.] is above 9.

For both bundles a significant reduction of substance needed is achieved. By filling the capillaries up to 4 cm we only need about 20 $\mu$l of substance solution (compared to about 600 $\mu$l for a standard NMR tube) per capillary.

It is emphasized that the geometry and materials of the capillary bundles suggested here are only examples of a much broader class of possible arrangements. In principle other capillaries (e.g. thinner in diameter) can be used. The strictly cylindrical setup and the 5 mm outer diameter are given by the geometry of the NMR spectrometer used. NMR spectrometers with a sensitive detection volume of up to 10 mm in diameter (which would increase the number of capillaries by a factor of 4) are commercially available.

384-well Plate

To demonstrate the applicability of the method for non-invasive structural analysis we filled the wells of a standard 384-well plate 18 with two different substances (see FIG. 4), positioned the complete plate in a medical NMR tomograph Biospec 40/47 (Bruker, Fällanden, Switzerland) and deconvoluted the data to chemical shift selective images. The wells 19 are filled with water, the wells 20 with DMSO, and the wells 21 with a mixture of these liquids.

2) Deconvolution of the NMR Data to Single Spectra

Taking a regular NMR dataset on a compartmented detection volume would result in a spectrum identical to that taken on a mixture of all compounds in a single volume detection cell. To get useful information the deconvolution of the data to single spectra is a prerequisite. To perform this task, we adopted a NMR technique known in the medical context of MRI. A typical question to be answered in this field is the spatial distribution of substances in certain organs within the human (animal) body. This means that a spatial information (organs e.g. liver) is combined with chemical information (e.g. positions of lines that correspond to glucose). The technique applied in MRI is known under the acronym CSI ("Chemical Shift Imaging") [Brateman, L., AJR 146: 971–980 (1986)]. The principle of the method rests on the application of controlled inhomogeneous magnetic field pulses (gradient pulses) to obtain information on the position of protons within a sample volume.

Gradient coils were only recently built in NMR spectrometers made for analytical chemistry for the purpose of coherence pathway selection and solvent suppression [Parella, T., Magn. Reson. Chem. 36: 467–495 (1998)]. Normally no spatial information needs to be obtained for chemical analysis, as only one compound in one single compartment is analyzed. Fortunately, the hardware nowadays available for analytical chemistry NMR spectrometers meets the requirements to obtain spatially resolved chemical information. An exemplary suited pulse sequence 25 is shown schematically in FIG. 5 in dependence on time (t-axis). The dataset taken is a 3D dataset, i. e. the signal amplitude with respect to the two space coordinates x and y and one spectroscopic dimension. Two dimensions (that correspond to the x and y direction of a plane intersecting all compartments orthogonally) are obtained by systematic incrementation of x-gradient 27 respectively y-gradient 28 pulses. For each setting of these gradients a regular 1D NMR spectrum as usual in analysis is taken whose parameters are adjusted to enable the extraction of the chemical information needed.

In the 1D $^1$H NMR experiment presented as an example, the first 90° HF pulse 29 creates transversal magnetisation. The evolution of chemical shift until the detection of the NMR signals starts is refocussed by the application of the succeeding 180° pulse 30. The x-gradient 27 and y-gradient 28 pulses whose strengths are incremented independently in equidistant steps, serve to encode the spatial distribution of magnetisation in the detection volume. For each setting of both gradient strengths an NMR signal 33 is detected and stored. The information on chemical shift is obtained by Fourier transformation of these signals with respect to the time acquired. The information on the spatial distribution is contained in the dependence of the initial phase of all signals on both gradient strengths. The image of the sample is obtained by Fourier transformation of all signals stored with respect to both gradient strengths.

It is to be understood that the x- and y-gradient pulse strengths was constant during each NMR measurement.

In our examples the z-gradient pulses 31 and 32 are used to remove imperfections of the 180° pulse. For 3D-arrays of samples (e.g. stacks of 2D-arrays of samples), the strength of this pulse would have to be incremented independently of the other directions in order to spatially resolve the NMR signal in the z-direction as well.

An exemplary parameter set of the spatial resolving pulses 27, 28 is set out below in more detail:

TABLE 1

| | | | |
|---|---|---|---|
| $-G_x + 0 \cdot \Delta G_x$ | $-G_x + 1 \cdot \Delta G_x$ | $\ldots -G_x + (n_x - 1) \cdot \Delta G_x$ | $-G_x + n_x \cdot \Delta G_x$ |
| $-G_y + 0 \cdot \Delta G_y$ | $-G_y + 0 \cdot \Delta G_y$ | $\ldots -G_y + 0 \cdot \Delta G_y$ | $-G_y + 0 \cdot \Delta G_y$ |
| $-G_x + 0 \cdot \Delta G_x$ | $-G_x + 1 \cdot \Delta G_x$ | $\ldots -G_x + (n_x - 1) \cdot \Delta G_x$ | $-G_x + n_x \cdot \Delta G_x$ |
| $-G_y + 1 \cdot \Delta G_y$ | $-G_y + 1 \cdot \Delta G_y$ | $\ldots -G_y + 1 \cdot \Delta G_y$ | $-G_y + 1 \cdot \Delta G_y$ |
| $-G_x + 0 \cdot \Delta G_x$ | $-G_x + 1 \cdot \Delta G_x$ | $\ldots -G_x + (n_x - 1) \cdot \Delta G_x$ | $-G_x + n_x \cdot \Delta G_x$ |
| $-G_y + 2 \cdot \Delta G_y$ | $-G_y + 2 \cdot \Delta G_y$ | $\ldots -G_y + 2 \cdot \Delta G_y$ | $-G_y + 2 \cdot \Delta G_y$ |
| $\ldots$ | $\ldots$ | $\ldots$ | $\ldots$ |
| $-G_x + 0 \cdot \Delta G_x$ | $-G_x + 1 \cdot \Delta G_x$ | $\ldots -G_x + (n_x - 1) \cdot \Delta G_x$ | $-G_x + n_x \cdot \Delta G_x$ |
| $-G_y + (n_y - 1) \cdot \Delta G_y$ | $-G_y + (n_y - 1) \cdot \Delta G_y$ | $\ldots -G_y + (n_y - 1) \cdot \Delta G_y$ | $-G_y + (n_y - 1) \cdot \Delta G_y$ |
| $-G_x + 0 \cdot \Delta G_x$ | $-G_x + 1 \cdot \Delta G_x$ | $\ldots -G_x + (n_x - 1) \cdot \Delta G_x$ | $-G_x + n_x \cdot \Delta G_x$ |
| $-G_y + n_y \cdot \Delta G_y$ | $-G_y + n_y \cdot \Delta G_y$ | $\ldots -G_y + n_y \cdot \Delta G_y$ | $-G_y + n_y \cdot \Delta G_y$ |

Table 1 shows an exemplary two-dimensional array of settings of the gradient strengths of the inhomogeneous magnetic fields Gx and Gy along the x respectively y axis for the x- and y-gradient pulses 27, 28. At a given duration of the gradients $t_i$ ($i \in \{x,y\}$) their strength $G_i$ is defined by the size $\Delta i$ of the sample along the corresponding dimension due to $G_i[Hz/cm] = 2\pi/(t_i[s]\Delta i[cm])$. The increments of strength are given by the required spatial resolution, i. e. by $\Delta G_i = G_i/(n_i+1)$. The numbers of increments ($n_i+1$), therefore, define the spatial resolution of the image.

Figure 6:
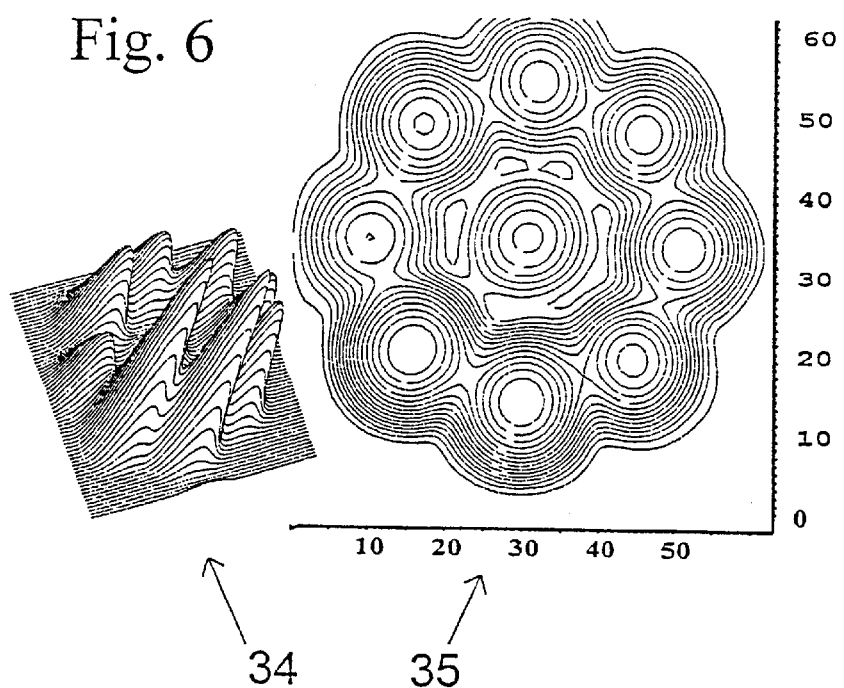

When Fourier-transformations (implemented on any modern NMR spectrometer) are applied with respect to the x- and y-gradient incrementation, the result of this treatment is a 2D "picture" of all compartments (cf. FIGS. 6–8). One can easily identify the individual compartments in these Figures. After a third Fourier-transformation of the data orthogonal to the spatial plane, the spectra necessary for structure determination are obtained. Hence, exemplary Fourier transforms used are:

Time/frequency transformation: $\bar{f}(\omega) = \sum_j e^{-i \, \omega t(j)} f(t(j)) \Delta t$ Time/y-coordinate transformation: $\bar{f}(y) = \sum_j e^{-i \, y G_y(j)} f(G_y(j))$ Time/x-coordinate transformation: $\bar{f}(x) = \sum_j e^{-i \, x G_x(j)} f(G_x(j))$ with $i = \sqrt{-1}$.

These transformations are well known, and algorithms to readily perform these transformations are integrated in modern NMR equipments.

The deconvolution method described is by no means restricted to the simple 1D homonuclear pulse sequence used here to extract chemical information. In modern NMR spectroscopy multidimensional (2D, 3D, etc.) homonuclear and heteronuclear pulse sequences play a substantial role.

Figure 5:
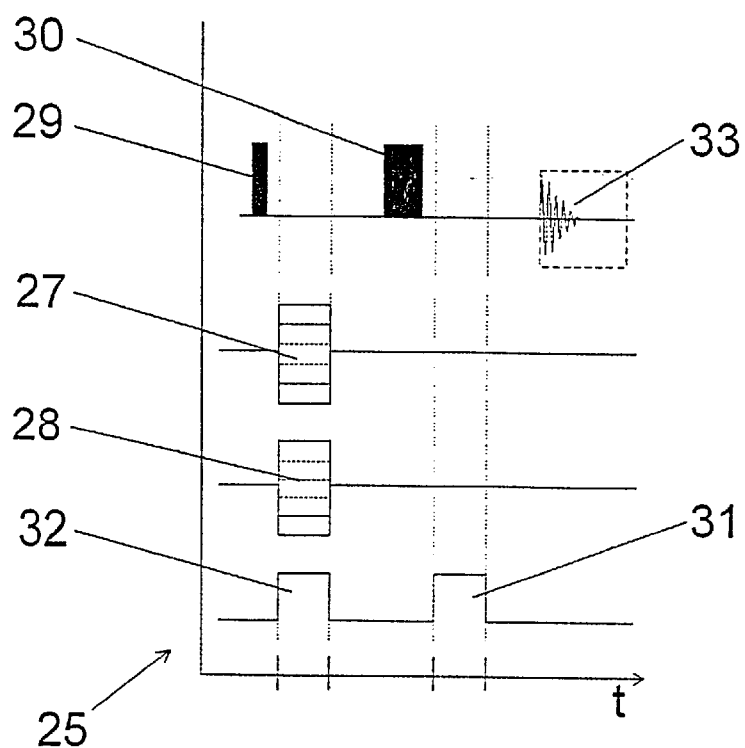
FIG. 5 Pulse sequence illustration.

Modification of most pulse-sequences to include a spatial encoding part as indicated in FIG. 5 is straightforward.

In order to obtain 3D spatial information of an arbitrarily compartmented arrangement, the (x,y)-encoding scheme can be easily adapted by an additional incrementation of the strength of the z-gradient pulse to obtain spatial information along the z-dimension of the compartment arrangement. This enables the application of the method to a broader, e.g. more densely packed, class of arrangements like e.g. stacks of well plates or stacks of bundles of capillaries.

MEASUREMENT EXAMPLE 1

Bundles of Capillary Tubes

The capillary tubes were completely filled using a syringe with 9 (19) substances which were taken arbitrarily from our NMR routine laboratory. The concentration of each compound dissolved in $d_6$-DMSO was adjusted to be around 10 mM. The solvent served as internal lock reference.

All data presented in this section were taken on a DMX spectrometer (BRUKER) operating at a basic frequency of 600 MHz equipped with a standard triple-axis gradient TXI probehead (BRUKER), which houses all gradient coils.

The temperature was set to 300 K. The proton pulsewidth was determined to be 8 µs. The interscan delay was set to 1 s. The maximum available strength of the gradient pulses was determined to be 5 Gauss/cm.

The size of each FID was set to 8 K (=8192) complex time datapoints acquired in the digital filtering and quadrature detection acquisition mode as implemented in the DMX spectrometer. The gradients were ramped from −10% to +10% of the maximum available strength in 16 steps. This resulted in a spatial resolution of roughly 5.0 mm/16≅300 µm/point. This procedure gave a final datamatrix of 16*16 (spatial)*8 K(chemical shift) data points. The total acquisition time by adding up a single scan per gradient setting was 5 min. Prior to acquisition of data 8 dummy scans were performed for thermal equilibration of the spin-system.

The data were processed using a matched exponential filtering along the chemical shift dimension and time-centered sine functions along both spatial dimensions together with $1^{st}$ order phase correction as needed in all dimensions in order to improve the signal-noise ratio.

After zero-filling we ended up with a final datamatrix of 64*64(spatial)*8 K(chemical shift) datapoints. The 2D images of the capillary bundles presented in FIG. 6 and FIG. 7 were extracted from the datasets after performing Fourier-transformations along the spatial dimensions only. They each show a 3D representation 34 and a two-dimensional contour plot 35 with the signal amplitude indicated as lines of constant amplitude. The units of the axes are points of the data set in the respective spatial dimension.

Figure 9:
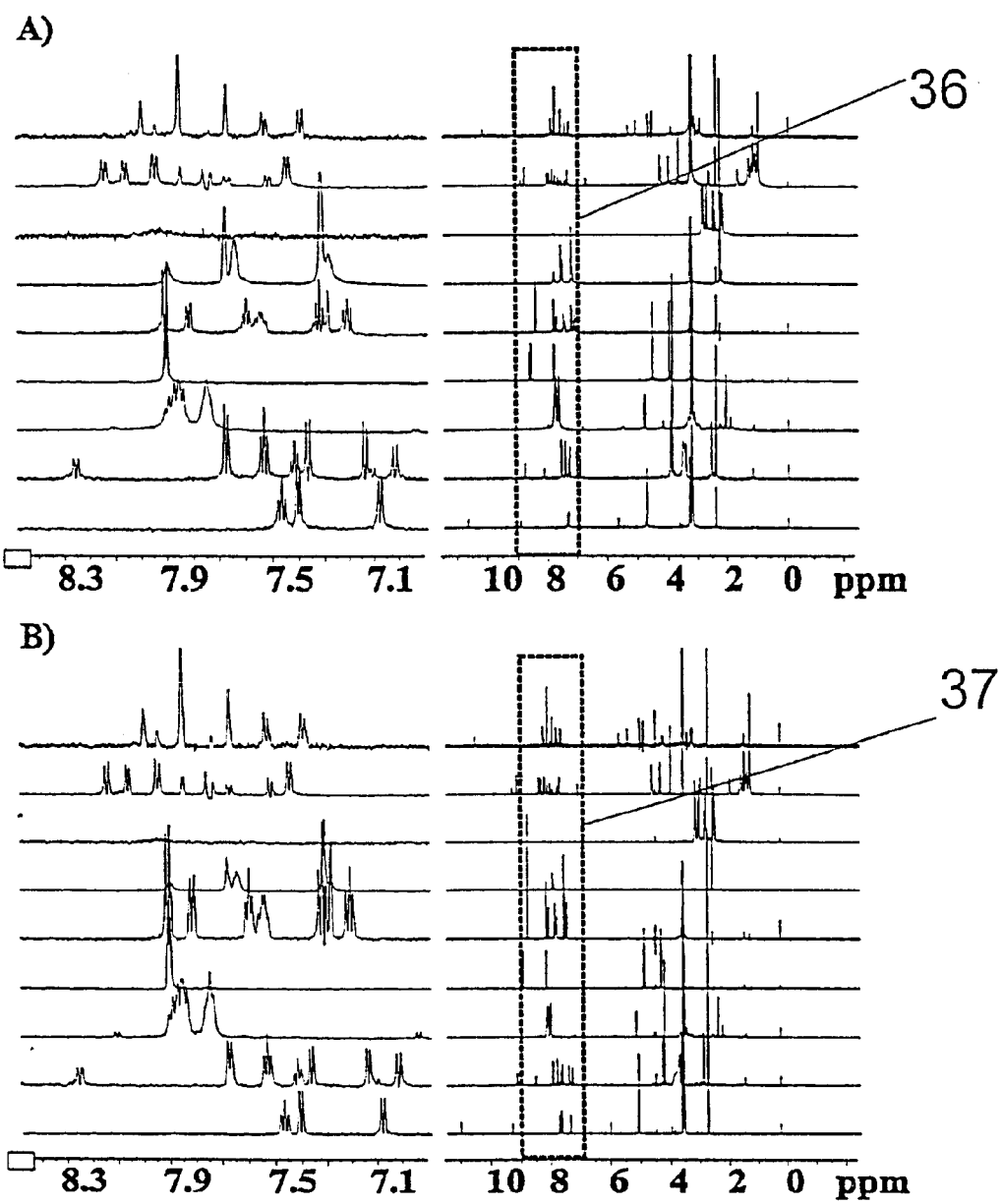
FIG. 9 Analytical spectra taken using a 9 sample bundle, with (a) and without (b) the interstices being filled with DMSO.
Figure 10:
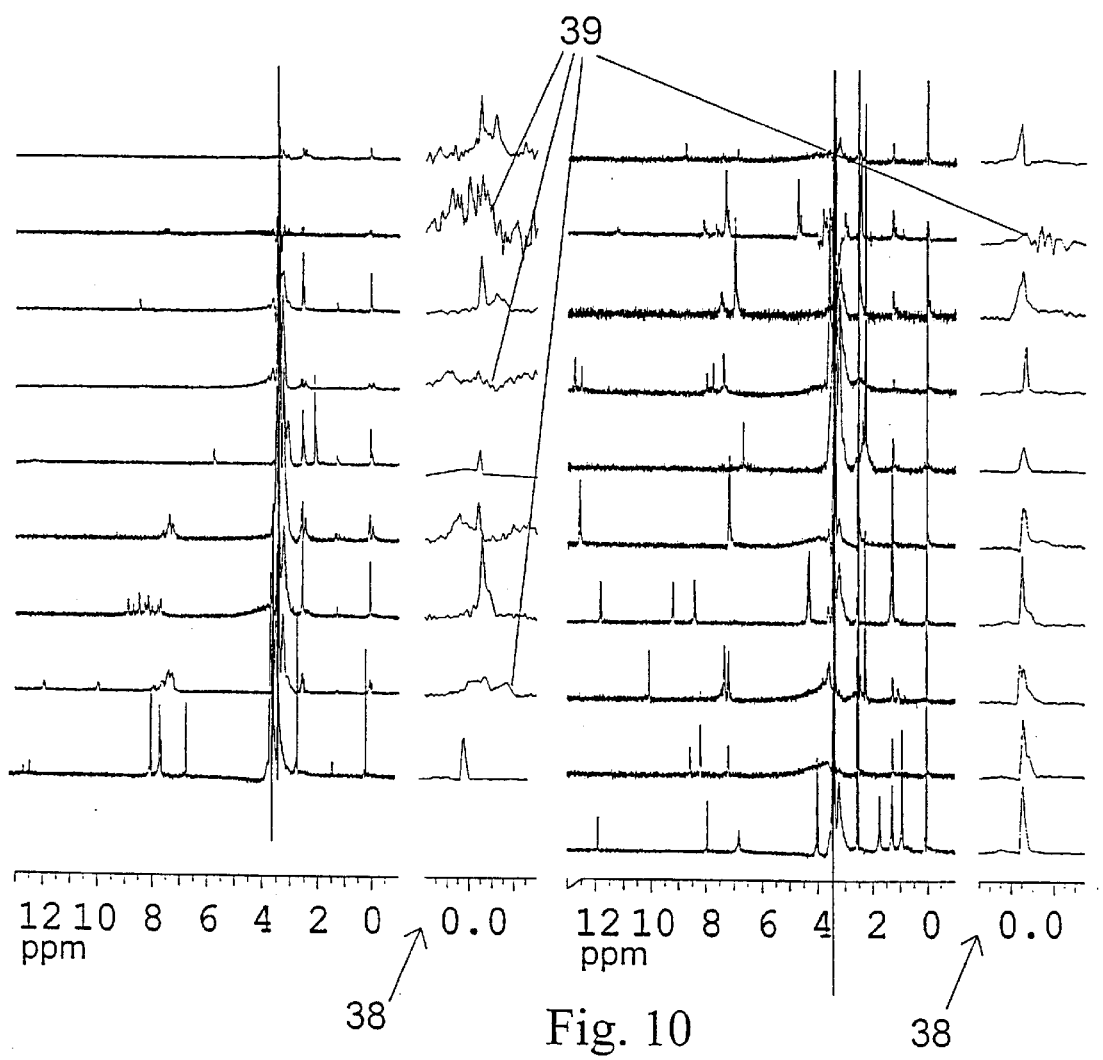
FIG. 10 Analytical spectra of a 19-sample bundle.

The spectra shown in FIG. 9 respectively FIG. 10 were extracted by visually determining the x,y coordinates of the individual capillaries by examination of the 2D images (cf. FIGS. 6, 7), and extracting the associated NMR spectra from the dataset at these x,y coordinates. This task can be automated using known peak-picking algorithms.

FIG. 9 shows the 1D NMR spectra obtained with A) and without B) filling the interstice between the capillaries with the solvent. On the left side, the domains 36 framed on the rights side are shown at an enlarged scale.

For the reference experiment (FIG. 9A)) the intercapillary volume was filled with $d_6$-DMSO. Prior to the acquisition of the data a bundle of capillaries filled with 90% $H_2O/D_2O$ mixture was used for a standard two-step gradient shimming protocol. Low order off-axis shims were manually adjusted.

FIG. 9B) shows the 1D NMR spectra obtained when the interstice between the capillaries are not filled with the solvent. Surprisingly, the quality of the NMR spectra was almost not influenced. Therefore, it is expected that the filling of the interstice for improving the quality of the magnetic field is generally not necessary.

FIG. 10 shows the 1D spectra simultaneously obtained for 19 samples using the 19 samples bundle. For quality assessment, the domain around 0 ppm chemical shift is shown enlarged 38 to the left of each spectrum. The spectra 39 are sensibly disturbed by air bubbles as can be derived from the shape of the signal of the reference substance. This problem can be resolved using degassed solvents.

MEASUREMENT EXAMPLE 2

384-Well Plate

Figure 4:
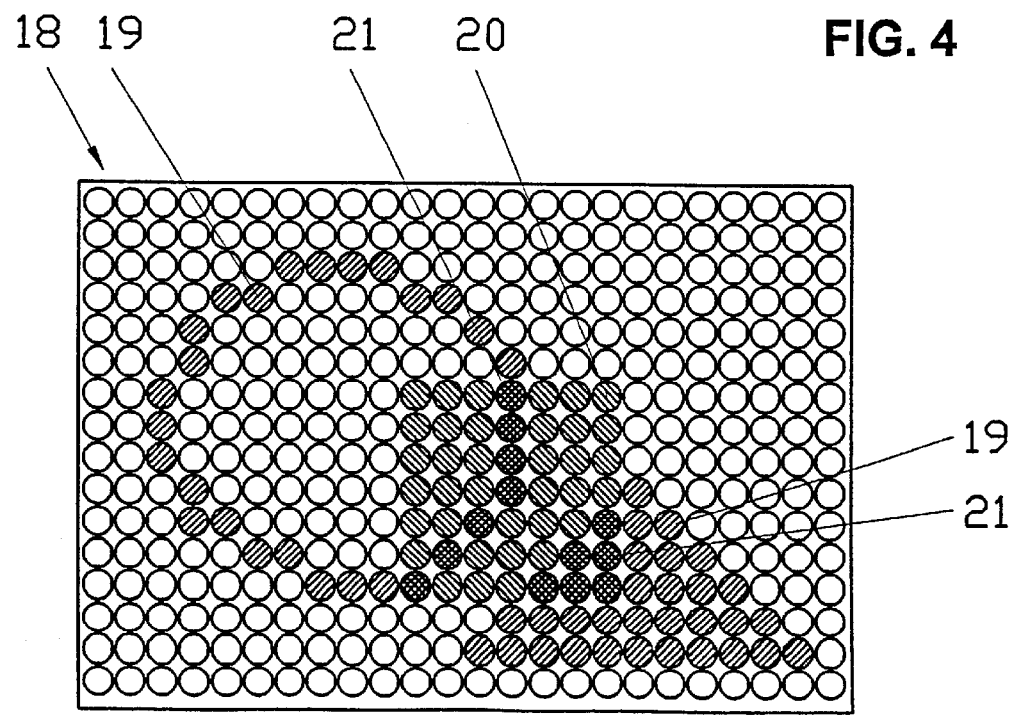
FIG. 4 Schematic representation of a 384-well plate filled with demonstration samples.

Two test substances were pipetted in the wells of a 384 standard well plate mimicking a triangle and an ellipsoid with water (wells 19 and 21) and a rectangular shape with DMSO (wells 20 and 21). The remainder of the wells was left empty. FIG. 4 shows a schematic representation of the well plate. We colored the substances displaying the geometric shapes using crystal violet (Aldrich Chemicals).

The data were taken at room temperature on a Biospec 47/40 tomograph (BRUKER) operating at a basic frequency of 200 MHz. The plate was oriented in the x-z-plane of the tomograph. Neither locking nor shimming was performed. The proton 90° pulse was set to 200 µs. The interscan delay was 2 s. The gradient strength was adjusted to obtain a complete picture of the well plate. The linear ramping of these gradients was done in 64 and 32 steps in the z- respectively x-spatial encoding dimension. The resulting datamatrix of 64(z)*32(x)(spatial)*512(chemical shift) data points was processed using the same window functions as described above. The resulting size of the datamatrix was 256*128(spatial)*512(chemical shift) datapoints.

In FIG. 8, we show x–z planes extracted from the processed dataset at the chemical shifts of water 42 and DMSO 43. It is clearly evident that the geometrical shapes corresponding to the different chemical species can easily be resolved. However, the spectra of the wells containing a mixture are not clearly detectable, as medicinal tomographs do not provide the needed spectral resolution to obtain clearly discernable images of the wells. Thereby, it is demonstrated as well that measuring analytical NMR spectra of the contents of each well is far beyond the capabilities of the commercially available hardware in use (MRI spectrometers and well plates).

From the examples, the following improvements over the prior art are shown:

1) Increase of the throughput of samples by at least a factor of 10. This is readily achieved on any state of the art commercially available NMR spectrometers. The only additional prerequisite is the availability of miniaturized compartmented sample containers that allow the acquisition of NMR data for a set of substances in parallel.
2) In addition we have shown that the same concept can be used to perform "non-invasive" structural verification on complete 384 well plates having the advantage to prevent any loss of substance for the acquisition of the data.

From the description of the preferred examples, the one skilled in the art may derive further modified embodiments of the invention without leaving the scope of the invention as defined by the claims. For instance, the following variations have been thought of:

The design of our capillary bundles is based on the geometry nowadays available for NMR spectrometers. In order to optimize the throughput, other geometries of the detection volume might be advantageous.

The examples illustrated a 2D version of the method: Only two encoding dimensions for spatial separation of samples were used. In general a 3D approach using e.g. stacks of bundles of capillaries (respectively well plates or other containers) can be achieved by a simple modification of the pulse sequence in use. The exemplary choice was governed by the geometry of the detection volume of currently available NMR spectrometers (ca. 1 cm length of detection volume).

A sample container setup was used, i. e. the capillaries were filled before transferring prepared bundles to the spectrometer. But the approach is applicable without modification to bundles of flow-through capillaries positioned inside the detection volume of the spectrometer. In this case, the whole bundle of capillaries could be filled by a bundle of transfer capillaries hooked up to a dedicated probehead. This would be the compartmented equivalent of the flow-through setup as described in the introduction. The approach of simultaneous detection with a single detection coil has the advantage to combine the gain in throughput achieved by the flow-through setup with that realized by the CSI based compartmentation method according to the invention.

The filling of the compartments can be done manually or fully automated using a commercially available stand-alone robot, e. g. Probot (bai GmbH, Lautertal, Germany). This has the advantage that the time-limiting filling of the compartments can be performed in parallel by several robots.

Alternatively, an on-line setup is possible: The sample preparation robot to fill the compartmented sample containers is an integrated part of a sample transfer system to perform the whole procedure comprising filling of sample, transfer to/from the magnet and detection volume of the NMR device in a fully automated way. This was successfully tried with a "GENESIS" robot (TECAN, Hombrechtikon, Switzerland). As "input" for both sample handling setups, standard storage well plates or any other sample containers can be used.

In order to optimize the homogeneity of the magnetic field, the sample container may comprise a hull containing the sample compartments, so that the interstice between the compartments themselves and the hull can be filled with a liquid. The liquid is chosen of a magnetic susceptibility as similar as possible to the material of the hull and the compartments, so that the walls of the compartments, the filling in the interstice and the hull form a volume of almost constant susceptibility. Thereby, disturbing of the magnetic field by crossing the walls of the compartments is minimized.

Furthermore, the interstice of the sample container may be filled and sealed at the production site, so that the user obtains the sample container ready for use.

Instead, or additional to $^1$H NMR measurements, other nuclei providing a nuclear spin may be used, like $^{13}$C, $^{15}$N, $^{19}$F, $^{31}$P.

Glossary

| | |
|---|---|
| 1D | one-dimensional; in connection with an NMR spectrum: a spectrum showing amplitude vs. one independent variable, e. g. the chemical shift; |
| 2D | two-dimensional; in connection with conventional NMR spectra, meaning as above 1D, yet with two independent variables; |
| 3D | three-dimensional; in connection with conventional NMR spectra, meaning as above 1D, yet with three independent variables; |
| capillary tube | if not otherwise defined: a capillary with one end closed. |
| CSI | Chemical shift imaging; |
| DMSO | Dimethyl-sulfoxid, $(CH_3)_2SO$; |
| DMSO-$d_6$ | fully deuterated DMSO, $(CD_3)_2SO$ |
| FID | free induction decay = detected signal |
| HF | high frequency, also rf: radio frequency |
| i. d. | inner diameter |
| K | as a magnitude indicator: indicates a multiplier of $2^{10}$ = 1024. |
| 1 mM | $10^{-3}$ Mol per liter; also: mmol/l |
| MRI | Magnetic resonance imaging |
| NMR | Nuclear magnetic resonance; |
| o. d. | outer diameter |
| shimming | homogenization of the magnetic field over the detection volume |

Upon reading the present specification, various alternative embodiments will become obvious to the skilled artisan. These variations are to be considered within the scope and spirit of the subject application, which is only to be limited by the claims that follow and their equivalents.

What is claimed is:

1. A method for determining analytical high resolution NMR spectra for each of at least two chemical compounds that are each contained in an individual sample, the NMR spectra being suitable for structure determination or structure verification of each of the at least two chemical compounds, which method comprises:

(a) placing at least two samples, each containing one of the at least two chemical compounds, within the detection volume of a detection coil in an NMR measuring apparatus;

(b) applying at least one spatially inhomogeneous magnetic field that penetrates the at least two samples within the detection volume of the detection coil in the NMR measuring apparatus, the at least one spatially inhomogeneous magnetic field having certain predetermined characteristics;

(c) measuring the NMR after applying the at least one spatially inhomogeneous magnetic field, the characteristics of the inhomogeneous magnetic field, including the degree of spatial inhomogeneity, being set on at least two values to be measured; and (d) resolving the NMR signals picked-up by the detection coil during the measuring of the NMR using a spatially-resolving computational method, thereby determining the analytical high resolution NMR spectra for each of at least two chemical compounds.

2. The method according to claim 1, wherein the spatially resolving computational method comprises at least one Fourier transformation with respect to the variation of the inhomogeneity of the magnetic field.

3. The method according to claim 2, wherein the at least one Fourier transformation with respect to the variation of the inhomogeneity of the magnetic field is one Fourier transformation per space coordinate.

4. The method according to claim 1, wherein one detection coil encompasses all the samples penetrated by the magnetic field.

5. The method according to claim 4, wherein one detection coil encompasses all of the samples penetrated by the magnetic field and all the samples are encompassed in the detection volume of the NMR measuring apparatus.

6. The method according to claim 1, wherein at least two spatially inhomogeneous magnetic fields are applied, and the spatially-resolving computational method yields NMR signals with respect to the coordinates of the at least two spatially inhomogeneous magnetic fields in order to determine the individual NMR signals of the samples in a two-dimensional arrangement.

7. The method according to claim 6, wherein at least three spatially inhomogeneous magnetic fields are applied, and the spatially-resolving computational method yields NMR signals with respect to the coordinates of the at least three spatially inhomogeneous magnetic fields in order to determine the individual NMR signals of samples in a three-dimensional arrangement.

8. The method according to claim 1, wherein the samples are each contained in a capillary tube, and the capillary tubes are arranged as a bundle having a cross-section which is approximately circular so that the shape of the bundle of capillary tubes closely corresponds to the shape of a single standard sample tube of the kind used for NMR measurements.

9. The method according to claim 8, wherein the capillary tubes have a volume of about 30 µl or less.

10. The method according to claim 8, wherein the capillary tubes have a cross-sectional area of at most 1 mm$^2$.

11. The method according to claim 1, wherein the at least two samples are contained in at least one storing container that is placed within the detection volume of the detection coil in the NMR measuring apparatus in the NMR measuring apparatus.

12. The method according to claim 11, wherein the storing container is a multi-well plate.

13. A sample container adapted for being placed in the detection volume of an NMR measurement apparatus, the sample container is a self-supporting bundle of at least seven capillary tubes which are so configured, dimensioned and arranged so that NMR signals emitted by samples contained within the at least seven capillary tubes can be resolved by applying a spatially resolving computational method to NMR signals measured by a NMR measurement apparatus into which the bundle of capillary tubes has been introduced.

14. The sample container of claim 13, wherein the bundle comprises at least nine capillary tubes.

15. The sample container of claim 13, wherein the bundle comprises at least nineteen capillary tubes.

16. The sample container according to claim 13, wherein the capillary tubes are suitable for NMR measurements and have an open inlet end and an open outlet end, the open inlet end and the open outlet end being configured and dimensioned so that they are connectable to a sample supply and a sample disposal, respectively.

17. The sample container according to claim 13, wherein the capillary tubes are suitable for NMR measurements, are closed at one end and open at the other end, the bundle of capillary tubes having a cross-section which is approximately circular.

18. The sample container according to claim 17, wherein the capillary tubes have a volume of about 30 µl or less.

19. The sample container according to claim 17, wherein the capillary tubes have a cross-sectional area of at most 1 mm$^2$.

20. The sample container according to claim 13, wherein the sample container comprises an adapter that is configured and dimensioned such that the sample container can be held in the detection volume of an analytical NMR measurement device in replacement of a conventional NMR tube.

21. The sample container according to claim 13, wherein the sample container comprises a three-dimensional arrangement of capillary tubes.

22. The sample container according to claim 13, wherein the capillary tubes are suitable for NMR measurements, are closed at one end and open at the other end, the bundle of capillary tubes having a cross-section which is a regular polygon.

23. The sample container according to claim 13, wherein the capillary tubes are suitable for NMR measurements, are closed at one end and open at the other end, the bundle of capillary tubes having a cross-section which is a regular hexagon.

* * * * *